(12) United States Patent
Kitamura et al.

(10) Patent No.: US 6,596,549 B2
(45) Date of Patent: Jul. 22, 2003

(54) AUTOMATIC WIRING METHOD FOR SEMICONDUCTOR PACKAGE ENABLING DESIGN OF HIGH-SPEED WIRING FOR SEMICONDUCTOR PACKAGE WITH REDUCED LABOR

(75) Inventors: Tamotsu Kitamura, Nagano (JP); Takayuki Nagasaki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/945,964

(22) Filed: Sep. 4, 2001

(65) Prior Publication Data

US 2002/0028573 A1 Mar. 7, 2002

(30) Foreign Application Priority Data

Sep. 7, 2000 (JP) .......................................... 2000-271290

(51) Int. Cl.⁷ .......................... H01L 21/28; H01L 21/60
(52) U.S. Cl. ............................. 438/6; 438/123; 438/599
(58) Field of Search ............................ 438/6, 123, 599, 438/FOR 369

(56) References Cited

U.S. PATENT DOCUMENTS

| 5,925,925 | A | * | 7/1999 | Dehaine et al. ............. 257/659 |
| 6,059,624 | A | * | 5/2000 | Dehaine et al. ............. 228/104 |
| 6,245,599 | B1 | | 6/2001 | Goto et al. |
| 6,323,548 | B1 | * | 11/2001 | Hiraga ........................ 257/692 |

* cited by examiner

*Primary Examiner*—George Pourson
(74) *Attorney, Agent, or Firm*—Paul & Paul

(57) ABSTRACT

An automatic wiring method for a semiconductor package includes: a provisional wiring step for sequentially specifying a plurality of lines of the terminals from the innermost periphery to the outermost periphery of bonding pads, connecting the bonding pads to predetermined vias present on the specified line of the terminal with line segments, and provisionally determining a wiring route for each line of the terminal such that the line segment passes through between the vias in each line of the terminal at equal intervals; and a wiring formation step for forming the wiring based on a design rule such that the wiring pattern passes through between the lines of the terminals with uniform intervals between wires based on the provisionally wired wiring routes.

5 Claims, 18 Drawing Sheets

AUTOMATIC WIRING METHOD FOR SEMICONDUCTOR PACKAGE ENABLING DESIGN OF HIGH-SPEED WIRING FOR SEMICONDUCTOR PACKAGE WITH REDUCED LABOR

BACKGROUND OF THE INVENTION

1. Field of the Invention

The present invention relates to an automatic wiring method for a semiconductor package by use of a CAD system, wherein bonding pads to be connected to semiconductor chips and vias around the bonding pads are disposed on a virtual plane, and a wiring pattern is formed by connecting the bonding pads to the vias.

2. Description of the Related Art

In the case of designing a wiring pattern of a semiconductor package like a PBGA (Plastic Ball Grid Array) or a EBGA by using the CAD system, the designing is carried out such that bonding pads (for example, wire bonding pads) to be electrically connected to electrode terminals of semiconductor chips (to be called a "chip pad") are connected with vias (land parts) that are disposed around the bonding pads, or the vias are connected to each other, on a virtual memory (virtual plane).

In general, the wiring for a printed circuit board (PCB) is arranged linearly in most cases, combined with a multi-wiring structure of a substrate. In most cases, the wiring is turned 90 degrees or 45 degrees at some portions.

On the other hand, in the case of a wiring in a semiconductor package, the wiring is arranged radially from die pads provided at the center of a substrate toward vias (lands) disposed relatively irregularly at peripheral portions. A die pad and a via are connected on a one-to-one basis.

Therefore, it is difficult to apply the wiring logic of the printed wiring substrate (PCB) straight to the designing of a wiring pattern for a semiconductor package. Particularly, in the case of a PBGA, gates are usually provided for sealing semiconductor chips with a resin on the substrate. Thus, the positions of vias (lands) tend to be irregular.

A general procedure of designing the wiring for a semiconductor package using the CAD system will be explained below.

The wiring is designed for each layer both when a substrate of a semiconductor package is wired in a single layer or is wired in multi-layers. The wiring is arranged as follows.

First, a designer determines the outline of a semiconductor package on the virtual plane, and determines the layout of lands (vias) on which connection terminals are formed, by using the CAD system.

Next, an outline of die pads for mounting semiconductor chips thereon is formed. Around the die pads, bonding pads are disposed optionally in a linear shape, or in zigzag pattern, or in the form of an arch.

Next, the bonding pads are connected to chip pads for semiconductor chips.

Next, each bonding pad is wired with each via (land), or a via is wired with another via, after determining each wiring route such that the wires do not cross each other. For example, in the case of a flip-chip connection, the wiring is arranged such that a wire passes through between a chip terminal connection and a via (land).

In general, lines and spaces between via parts (land parts) are calculated, and wiring routes are determined to satisfy a design rule. Then, wiring is simultaneously arranged from all of the bonding pads to the vias (lands). However, after this wiring, it may be necessary to design the wiring again in order to correct deviations in the wiring or in the positions of the vias (lands).

As a method developed for designing wiring for a semiconductor package, there is called the even-space method. In this method, automatic wiring is carried out using circular arcs and line segments on a CAD system, for example. Then, wiring or a positional deviations are corrected by increasing the width of a line segment or by making the intervals between wires (line and space) between the via parts uniform to some extent.

According to this method, concentric circles are drawn at equal intervals around vias, and a tangent line is drawn between specific concentric circles, thereby to automatically determine a wiring route between adjacent vias. Thereafter, deviations or concentration of wiring occurring as a result of the automatic wiring are corrected.

Once a designer has provisionally wired between the bonding pads and the vias (lands), the designer corrects intervals between the wires or positional deviations of the vias (lands). According to this method, it is not possible to limitlessly change the positions of the vias, and it is difficult to change the wiring positions in actual practice. As a result, it is sometimes necessary to design the wiring again.

Further, an attempt to simultaneously realize both the determination of wiring routes and the checking of whether the intervals between the wires satisfy the design rule or not makes the system complex. Therefore, there has been a problem in that it is difficult to expand or change the system, with a result that it is difficult to obtain a satisfactory wiring result.

The even-space method is relatively effective when the vias (lands) to be formed on the substrate of the semiconductor package are formed regularly at equal intervals. However, in actual practice, vias differ, depending on the specifications of the semiconductor package, and they result in irregular layout patterns in many cases. In particular, when surplus vacant space is formed around the vias, the wiring tends to become redundant or unbalanced.

In this case, it is necessary to carry out the wiring again by increasing the radius of a concentric circle of a via where the intervals between the wires are small. Alternatively, it is necessary to disconnect a circular arc and connect wires again, or to move the wires to other spaces. Such correction requires labor and time, and the advantages of automatic wiring cannot be enjoyed. Furthermore, wiring connection errors can easily occur.

It is an object of the present invention to provide an automatic wiring method for a semiconductor package which enables designing of the wiring for a semiconductor package at high speed with reduced labor, by executing a provisional wiring processing for provisionally determining only wiring routes separate from the execution of a wiring formation processing for carrying out the wiring again so that the provisionally-wired wiring routes satisfy a design rule.

SUMMARY OF THE INVENTION

In order to achieve the above object, according to one aspect of the present invention, there is provided an automatic wiring method for a semiconductor package using a CAD system, wherein bonding pads to be connected to semiconductor chips and vias around the bonding pads are disclosed on a virtual plane, and forms a wiring pattern by connecting the bonding pads to the vias.

This method comprises: a provisional wiring step for sequentially specifying a first line of the terminal to an n-th line of the terminal, from the innermost periphery to the outermost periphery, of the bonding pads, connecting the bonding pads to predetermined vias present on the specified line of the terminal with line segments, and provisionally determining a wiring route for each line of the terminal such that the line segment passes through between the vias at equal intervals; and a wiring formation step for forming the wiring based on a design rule such that the wiring pattern passes through between the lines of the terminals with uniform intervals between wires based on the provisionally wired wiring routes.

The provisional wiring step comprises:

a first step for specifying the first line of the terminal at the innermost side of the bonding pads, connecting some of the bonding pads to predetermined vias present on the specified first line of the terminal with line segments, drawing line segments from the rest of the bonding pads to a space between the vias such that the end points of the line segments are disposed at equal intervals, thereby to form the wiring routes using line segments that do not cross each other;

a second step for changing the positions of vias to correct deviations, when there are deviations in the wiring routes that pass through between the vias in the first line of the terminal; and a third step for sequentially specifying lines of the terminals after the first line of the terminal, connecting some of the vias present on the corresponding line of the terminal to some of the vias or the end points of the line segments present on the line of the terminal next to the corresponding line of the terminal, further drawing line segments from the rest of the vias or the end points of line segments other than the corresponding vias or the line segments to a space between vias present on the line of the terminal such that the end points of the line segments are disposed at equal intervals, thereby to form wiring routes with line segments that do not cross each other, and changing the positions of via parts to correct deviations, when there is a deviation in the wiring route that passes through between certain vias in any line of the terminal, thereby to provisionally determine the wiring routes from the bonding pads to the outmost line of the connection terminal by drawing the line segments.

The wiring formation step comprises:

a step for drawing concentric circular arcs around each via by setting a clearance (a gap) based on a design rule, by using the provisionally wired wiring routes from the bonding pads to the outermost vias, and forming a wiring pattern by drawing tangential lines between the circular arcs where the provisionally wired line segments cross the circular arcs and between the circular arcs and the vias where the circular arcs cross the vias;

a step for drawing a circular arc for modification by taking into account the distance between vias when a deviation has occurred in the wiring pattern that passes through the vias, and connecting the circular arc for modification to the tangent line;

and a step for correcting the wiring pattern, according to need, by changing the shape of a connection portion between the tangent line and the circular arc for modification with a line segment for modification having a length about one to three times the wiring width.

BRIEF DESCRIPTION OF THE DRAWINGS

The present invention will be more clearly understood form the description as set below with reference to the accompanying drawings, wherein.

DESCRIPTION OF THE PREFERRED EMBODIMENTS

Preferred embodiments of the present invention will be explained below with reference to the attached drawings.

In the present embodiment, there will be explained an automatic wiring method for a semiconductor package. According to this method, within an outline of a semiconductor package drawn on a virtual plane by using a CAD system, there are disposed die pads on which semiconductor chips are to be mounted, bonding pads to which electrode terminals of semiconductor chips (i.e., "chip pads") are to be wire-bonded, around the die pads, and vias (lands) around the bonding pads. Based on this arrangement, a wiring pattern for connecting between the bonding pads and the vias is designed automatically.

In many cases, the vias are formed on the lands. Therefore, in the present embodiment, the position of the via also refers to that of the land part. In the case of wiring on multi-layers, it is also assumed that a similar method is used to wire between one via and another.

Figure 7:
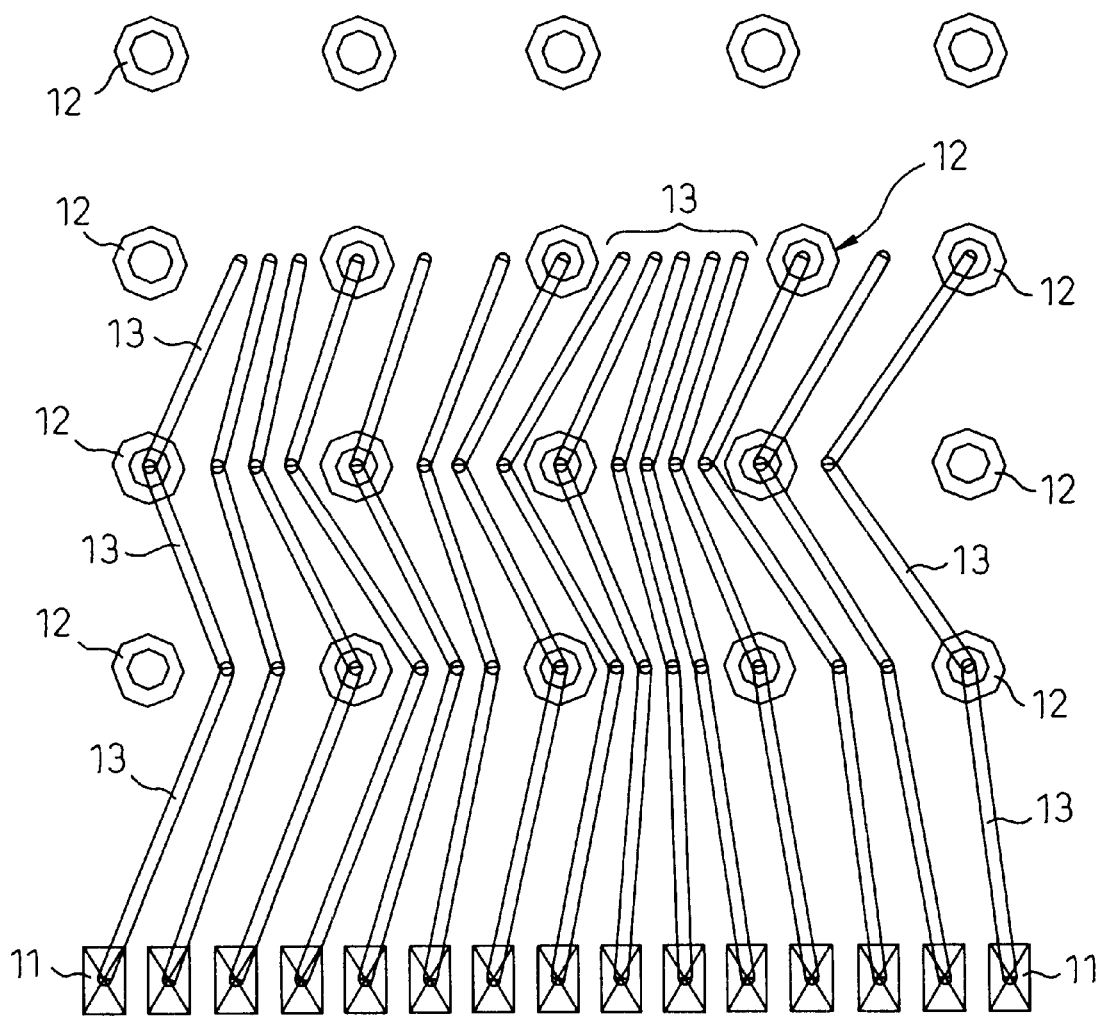
Figure 8:
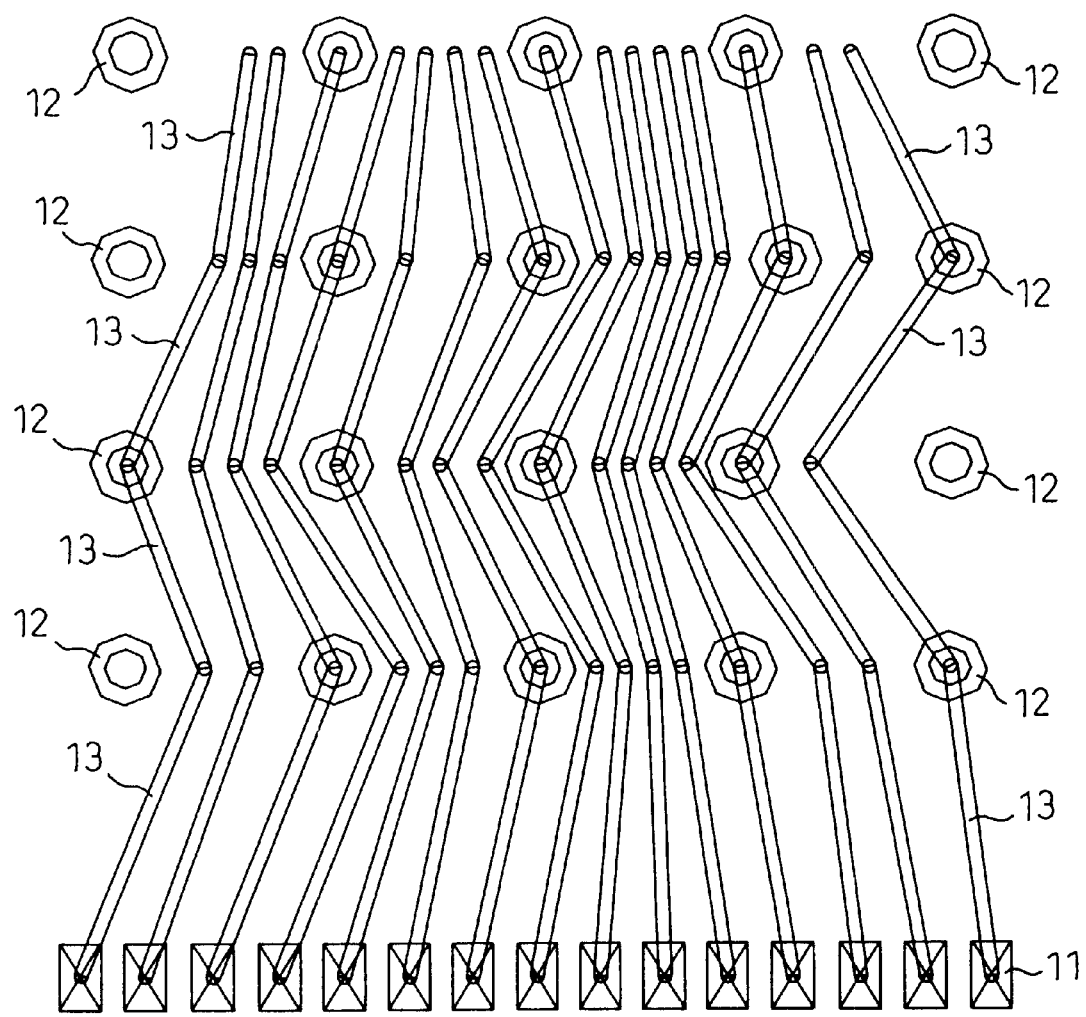
Figure 9:
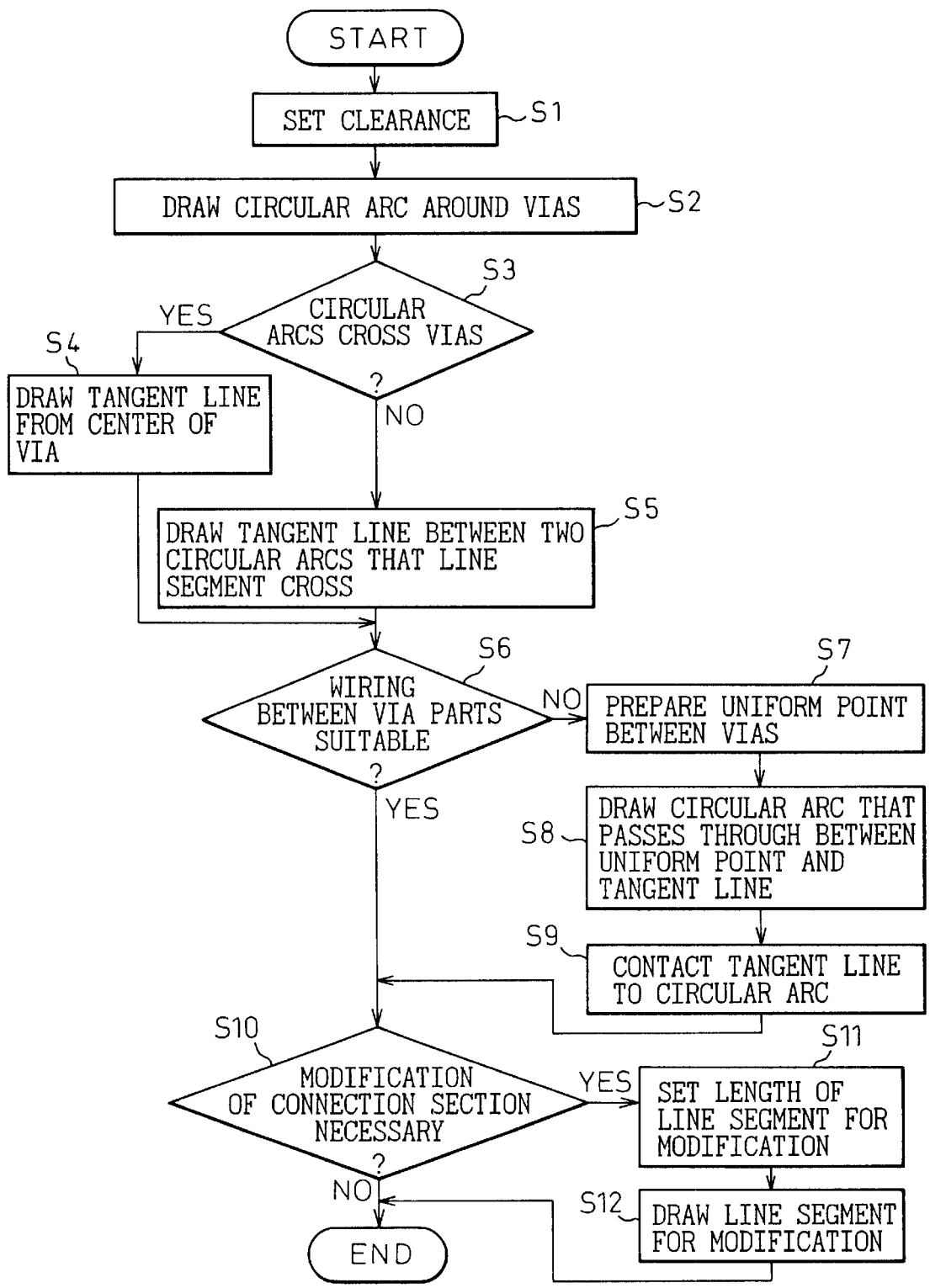
FIG. 9 is a flowchart showing a wiring formation process.
Figure 10:
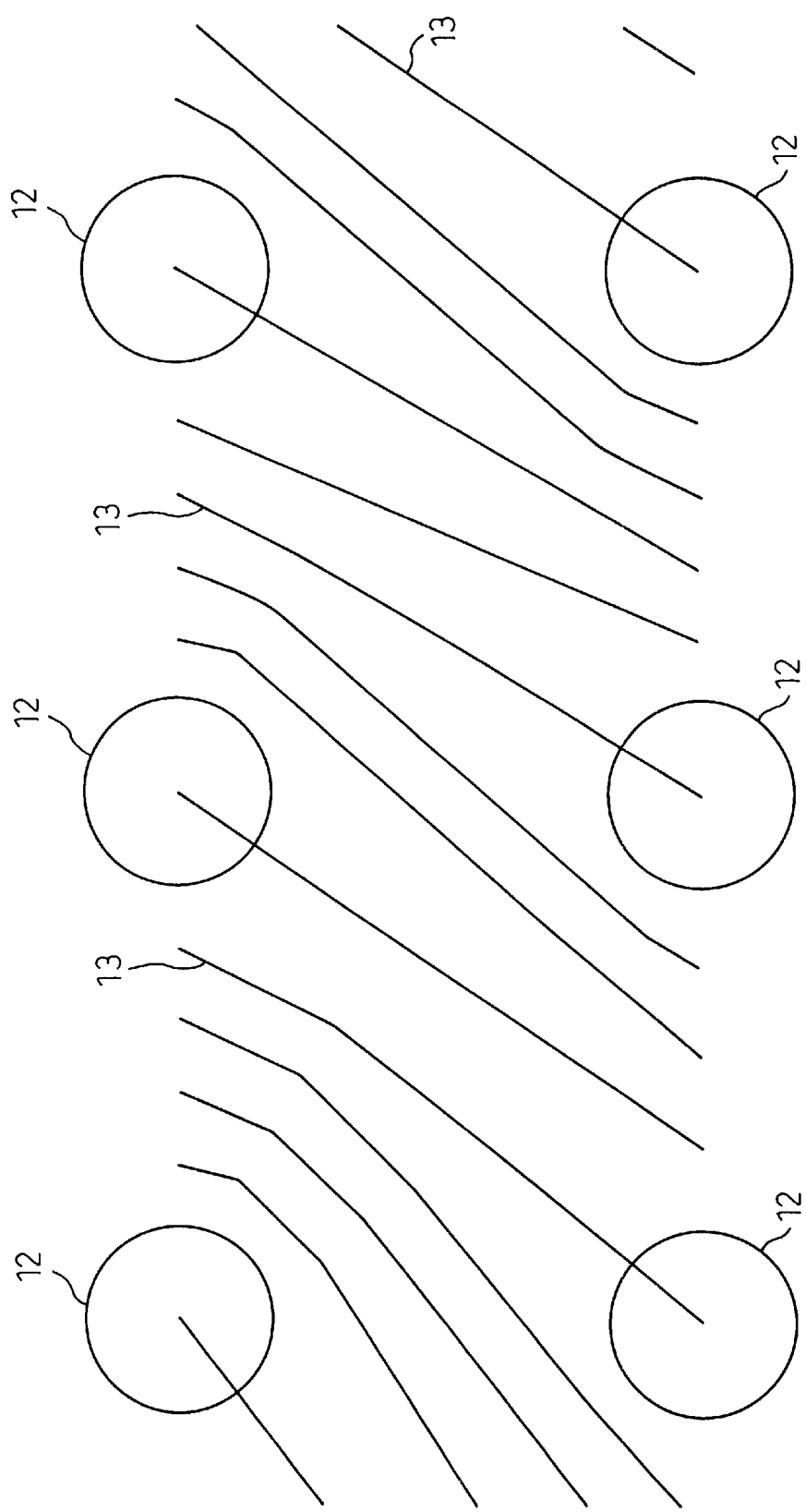
FIG. 10 to FIG. 17 are explanatory diagrams showing one example of a wiring formation process.

FIG. 1 to FIG. 8 are explanatory diagrams showing one example of provisional wiring. FIG. 9 is a flowchart showing a process of wiring formation. FIG. 10 to FIG. 17 are explanatory diagrams showing one example of a wiring formation process. FIG. 18 is a block diagram showing a structure of a CAD system.

First, a schematic structure of a CAD system that carries out a wiring designing for a semiconductor package will be explained with reference to the block diagram shown in FIG. 18.

Reference number 1 denotes a CAD system having a structure described below.

Reference number 2 denotes a CPU serving as a controller. The CPU 2 transmits instructions to each section of the CAD system 1 according to input information, and controls the operation of the system as a whole.

Reference number 3 denotes a ROM. The ROM 3 stores an operation program of the CAD system 1.

Reference number 4 denotes a RAM. The RAM 4 temporarily stores various kinds of data, and is used as a work area of the CPU 2.

Reference number 5 denotes an input section. The input section 5 has a keyboard and a mouse, and is input with various kinds of input data like the kind of a line, coordinate data, wiring width, and intervals between wires (clearance).

Reference number 6 denotes a display. The display 6 displays design data of the package.

Reference number 7 denotes a hard disk (HD). The hard disk 7 stores and manages the wiring design data for each layer in a file.

Reference number 8 denotes a drive unit. The drive unit 8 drives the incorporated hard disk 7, and drives an external storage medium like a floppy disk (FD) 9.

Reference number 10 denotes an input/output interface (I/O). The input/output interface 10 carries out exchanges of instructions and data between various sections like between the CPU 2 and the input section 5. The input/output interface 10 may be connected to the drive unit 8 for the hard disk and the floppy disk, and a printer.

The CPU 2 reads a design processing program stored in the ROM 3 to the RAM 4, carries out designing of the wiring on the virtual plane according to the information input from the input section 5, and displays the design result on the display 6. The wiring design data is stored in the hard disk 7 and the floppy disk 9.

The automatic wiring method for the package will be explained with reference to FIG. 1 to FIG. 17.

First, a designer determines an outline of a semiconductor package, and provisionally determines positions of lands (vias) on which connection terminals are to be formed, by using the CAD system 1.

Next, an outline of die pad parts on which semiconductor chips are to be mounted is formed. Around the die pads, a plurality of bonding pads are provisionally disposed in optional shapes like in a linear shape, in zigzag form, or in the form of a circular arc.

Next, the bonding pads are connected to chip pads.

Then, a provisional wiring is carried out such that the wires from the bonding pads to the vias (lands) do not cross, and line segments are combined to provisionally determine wiring routes.

Next, a wiring pattern that satisfies the design rule is formed based on the wiring formation.

The provisional wiring process and the wiring formation process will be explained in detail below.

In the provisional wiring process, a first line of the terminal to an n-th line of the terminal are sequentially specified from the innermost side to the outermost side of the bonding pads. The bonding pads are connected to predetermined vias present on the specified line of the terminal, with line segments that enable wires to pass through uniformly between the vias. Wiring routes are determined provisionally based on this combination of line segments.

The above method will now be explained in more detail.

Figure 1:
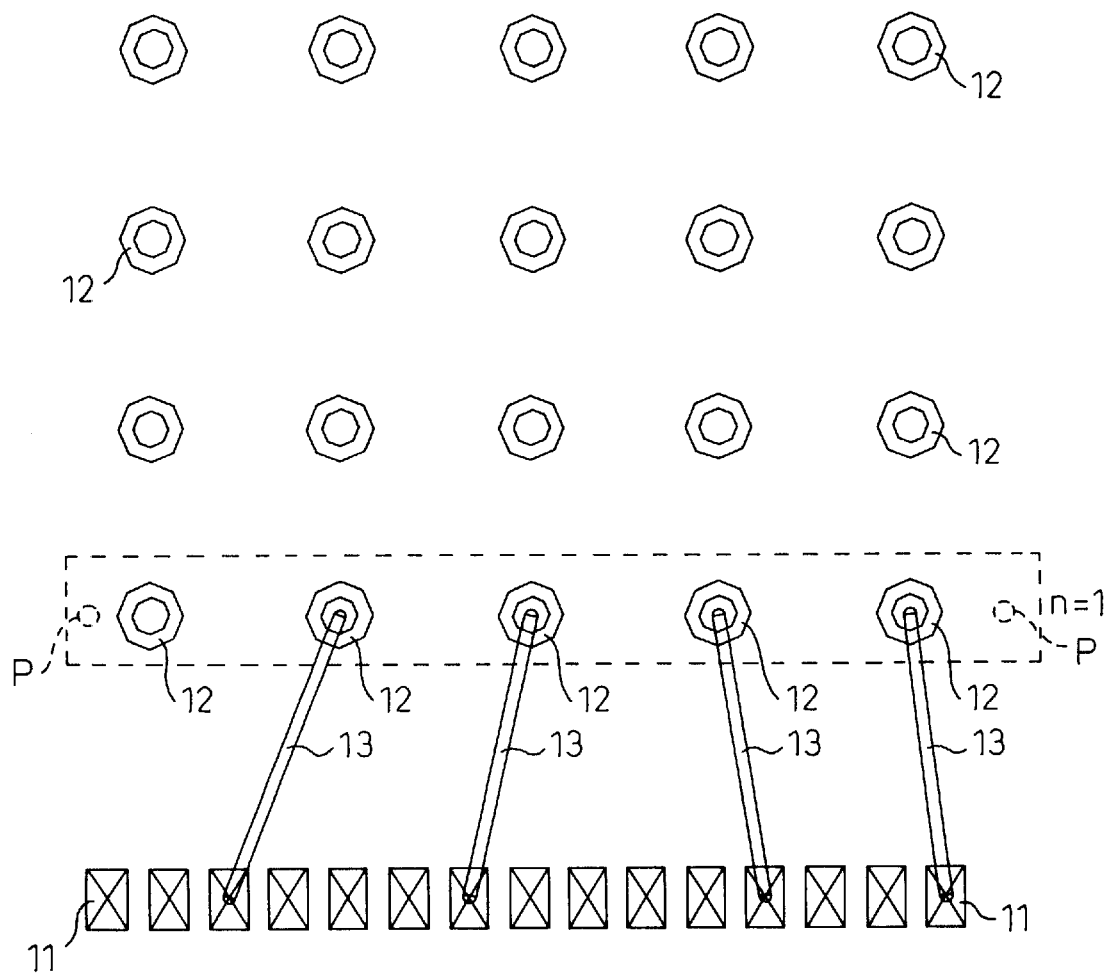
FIG. 1 to FIG. 8 are explanatory diagrams showing one example of a process of provisional wiring.

First, as shown in FIG. 1, virtual points P are provided at both sides. A first line of the terminal (n=1) at the innermost side of bonding pads 11 is specified to include the virtual points P. The line of the terminal is a portion encircled with a broken line in FIG. 1.

The bonding pads 11 are connected to predetermined vias 12 with line segments 13. The vias 12 that are connected to the bonding pads 11 are assigned in advance or are vias positioned closest to the bonding pads 11.

Figure 2:
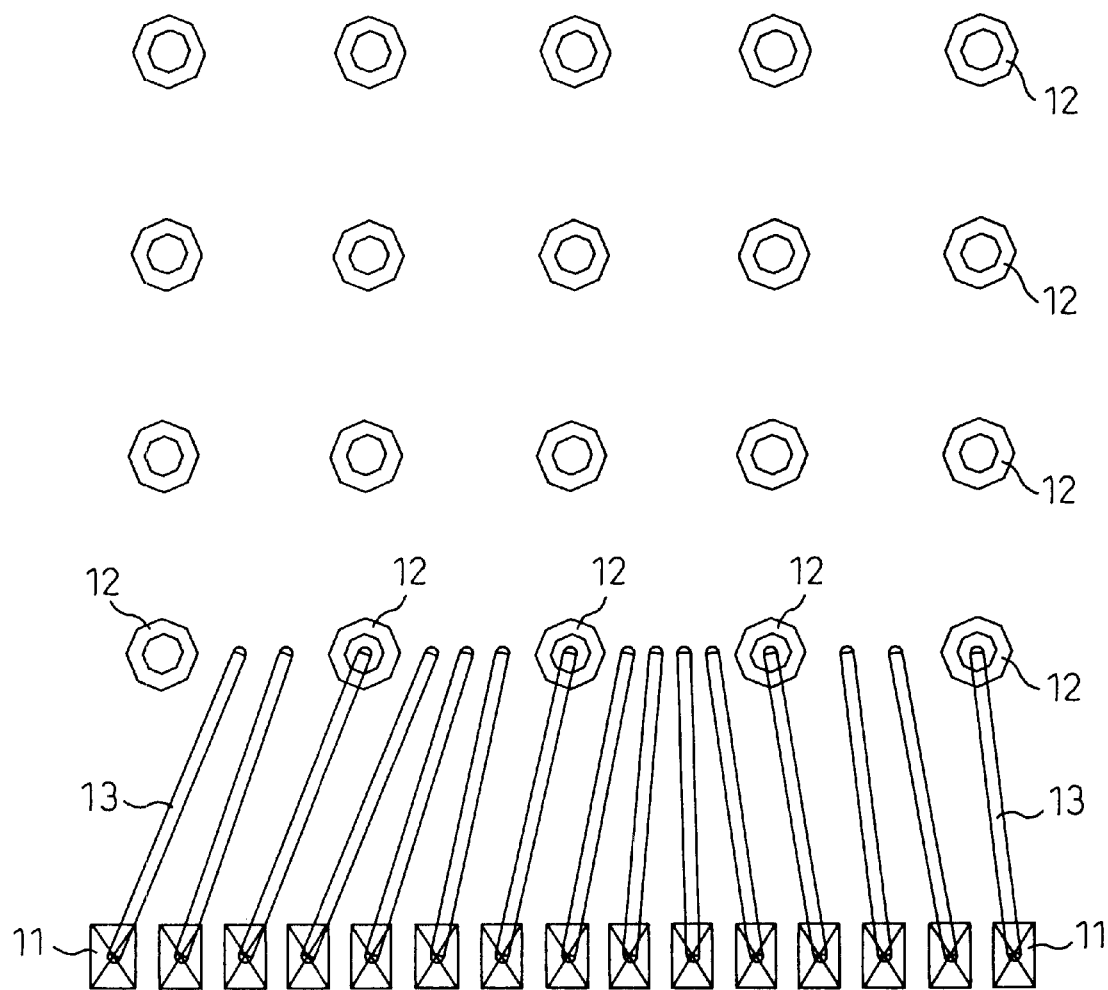

Next, as shown in FIG. 2, line segments 13 are drawn from the rest of the bonding pads to a space between the vias such that the end points of these line segments are at equal intervals between the vias without crossing. Thus, wiring routes are formed provisionally. In this case, the end points of the line segments 13 provisionally disposed between the vias 12 are disposed at equal intervals by taking into account the line and space between the mutually adjacent line segments in the first line of the terminal (n=1).

Figure 3:
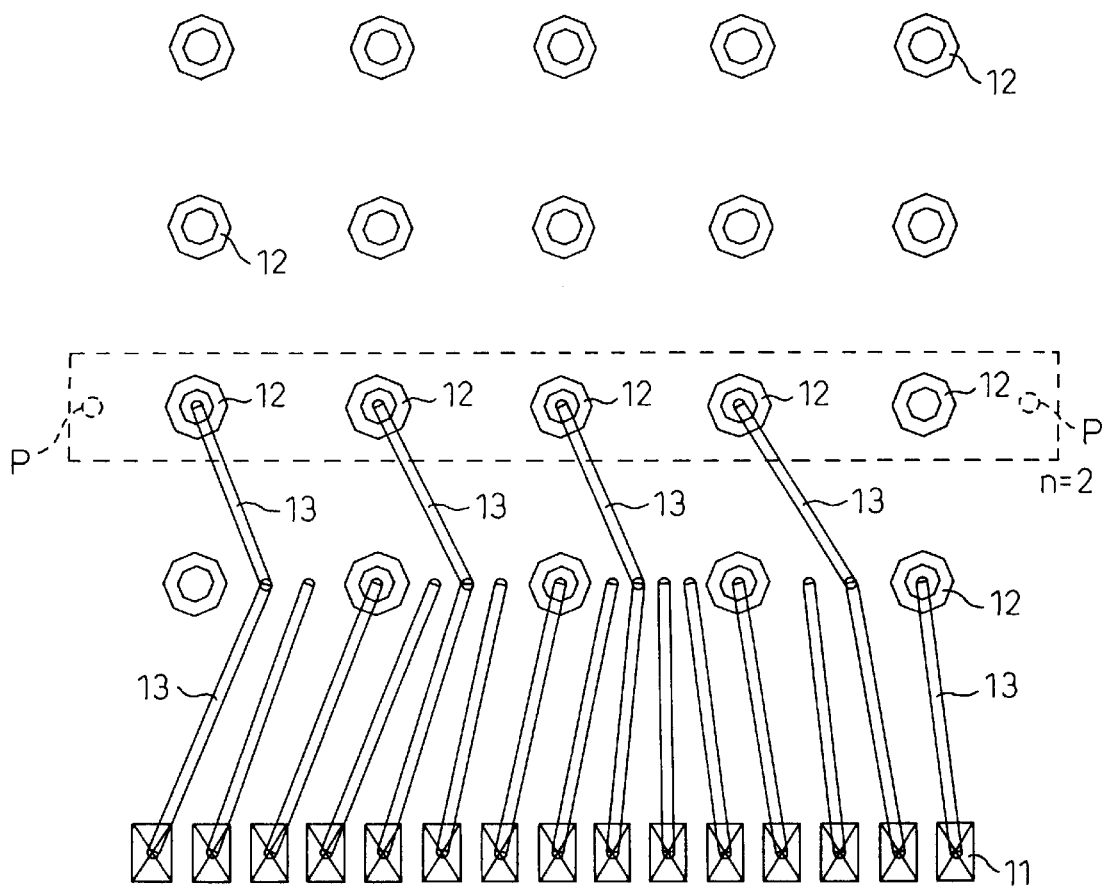
Figure 4:
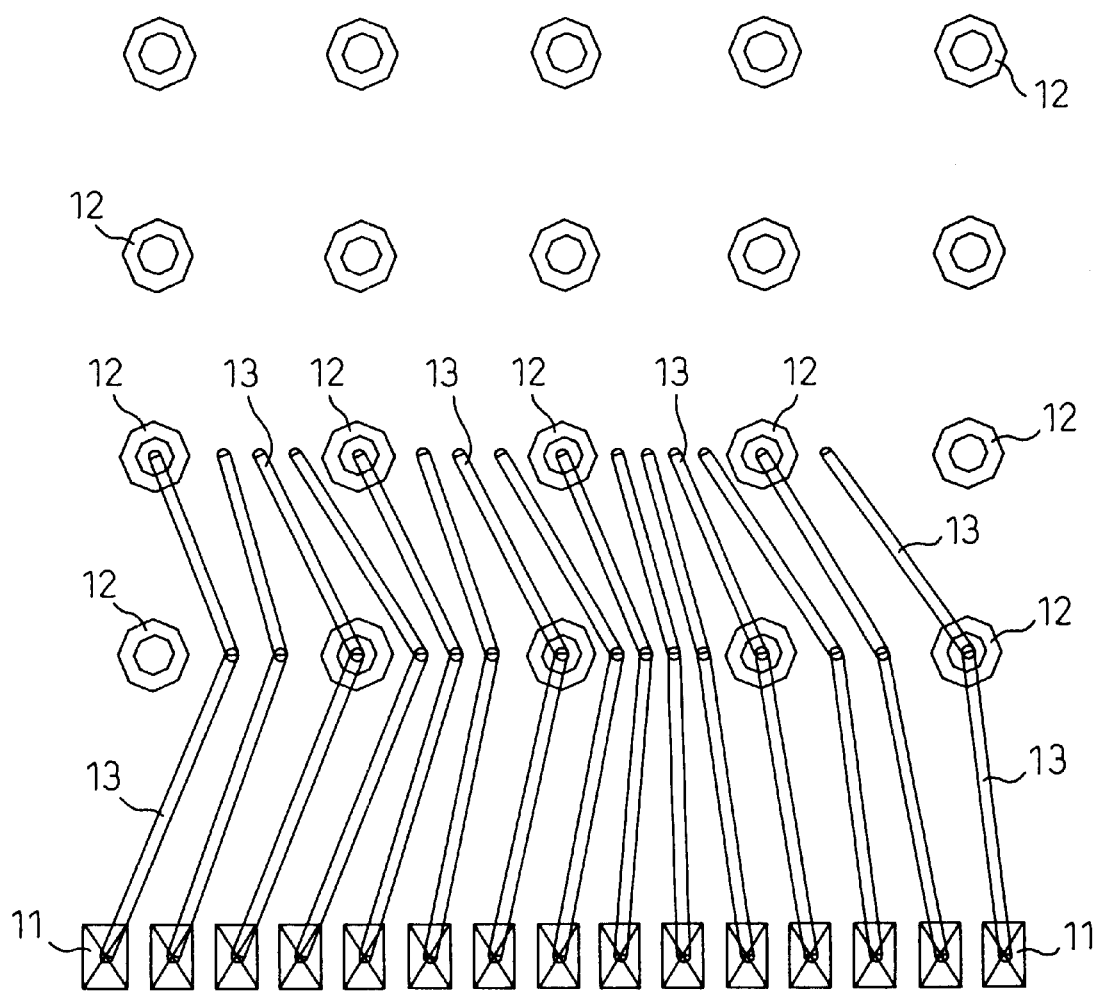
Figure 5:
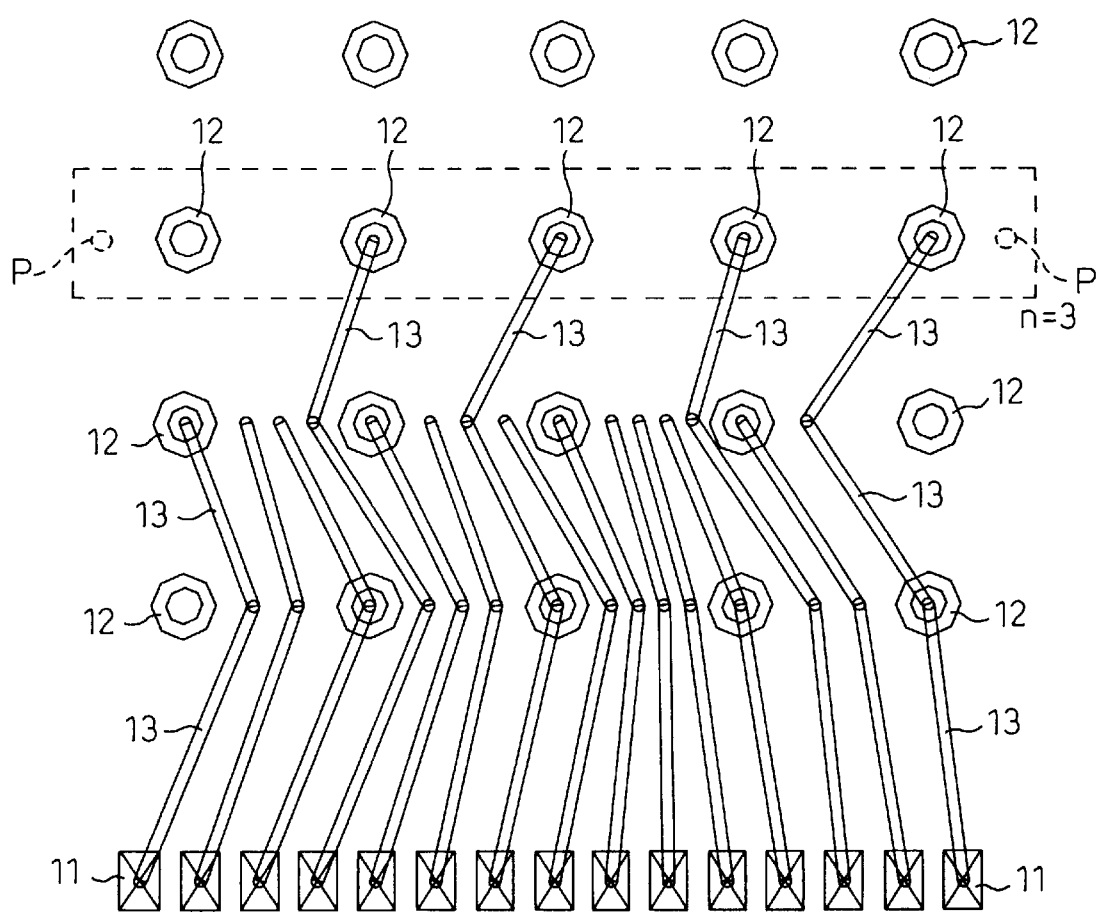
Figure 6:
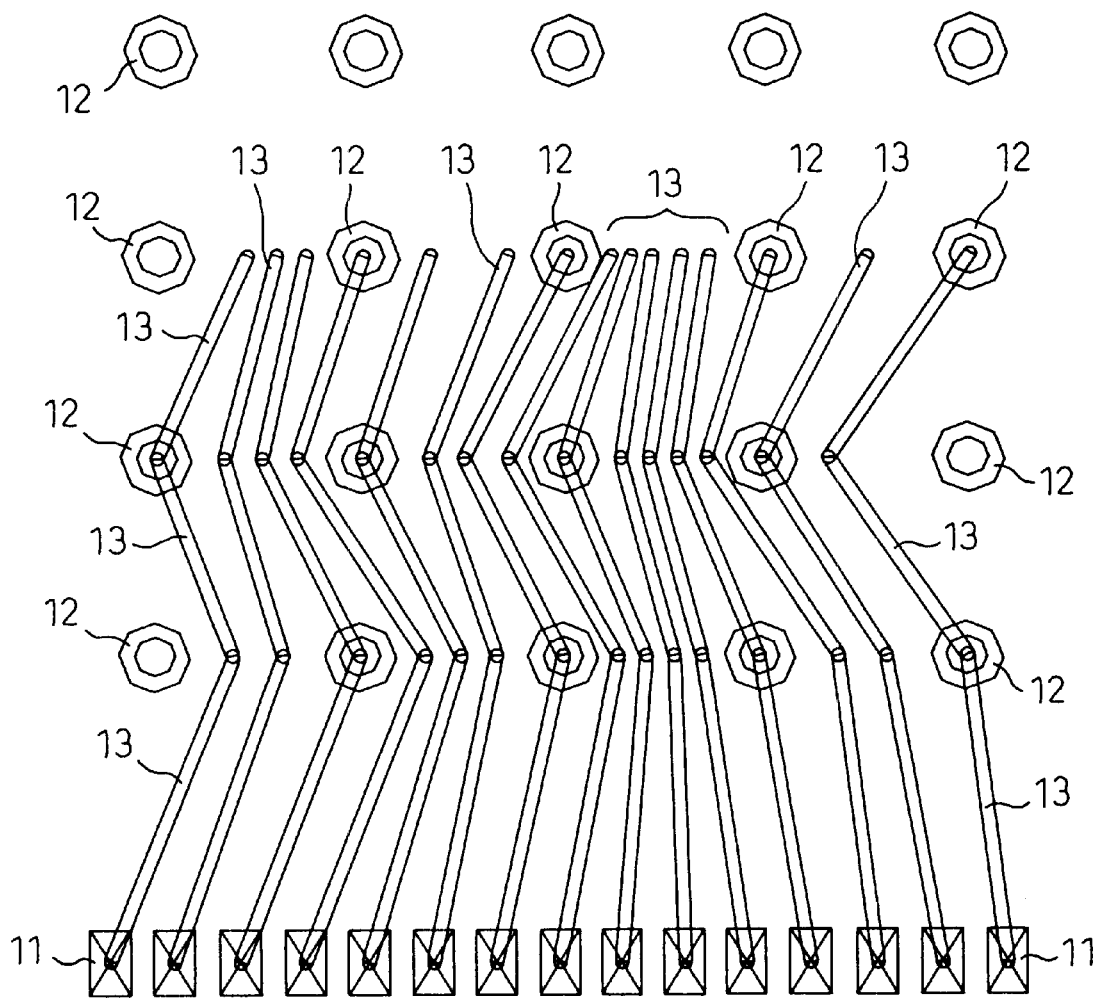

FIG. 3 and FIG. 4 show a situation in which the line segments 13 are drawn to the second line of the terminal (n=2) in a similar manner to that shown in FIG. 1 and FIG. 2. FIG. 5 and FIG. 6 show a situation in which the line segments 13 are drawn to the third line of the terminal (n=3) in a similar manner to that shown in FIG. 1 and FIG. 2. FIG. 7 and FIG. 8 show a situation in which the line segments 13 are drawn to the fourth line of the terminal (n=4) in a similar manner to that shown in FIG. 1 and FIG. 2.

In this case, when there is a deviation in the layout of an end point that belongs to the third line of the terminal as a result of forming the line segments 13 of the third row of the line segments in FIG. 6, the position of the corresponding via 12 (refer to an arrow mark in FIG. 7) is moved to correct this position such that the line and space become uniform.

The above work is repeated by sequentially specifying the lines of the terminals up to the n-th line thereof, and drawing the line segments to the vias 12 in the n-th line, thereby to form wiring routes. When there is a positional deviation, this is corrected. As a result, it is possible to determine the wiring routes (line segments 13) from the bonding pads 11 to the vias 12 in the outermost line of the terminal.

In this state, the lines and spaces between the adjacent end points of the line segments 13 in each line of the terminal are disposed uniformly. However, there are variations in the sizes of the interval between the line segments that connect between the lines of the terminals (refer to FIG. 10).

Thus, the wiring formation processing is carried out as follows.

In the wiring formation process, patterns 14 of the wiring from the bonding pads 11 to the vias 12 in the outermost line of the terminal are formed according to a design rule, based on the wiring routes provisionally determined in the provisional wiring process. Then, the wiring pattern is formed such that the wires pass uniformly through between the vias 12.

The wiring formation process will be explained for each situation based on the flowchart shown in FIG. 9 with reference to FIG. 10 to FIG. 17. As an example, a provisional wiring diagram will be used that shows a situation in which only the wiring routes have been determined from the bonding pads 11 to the vias 12 in the outermost line of the terminal.

First, at step S1 in FIG. 9, the designer sets a clearance (line and space), by inputting a set value of the clearance from the input section 5 (e.g. a keyboard).

Figure 11:
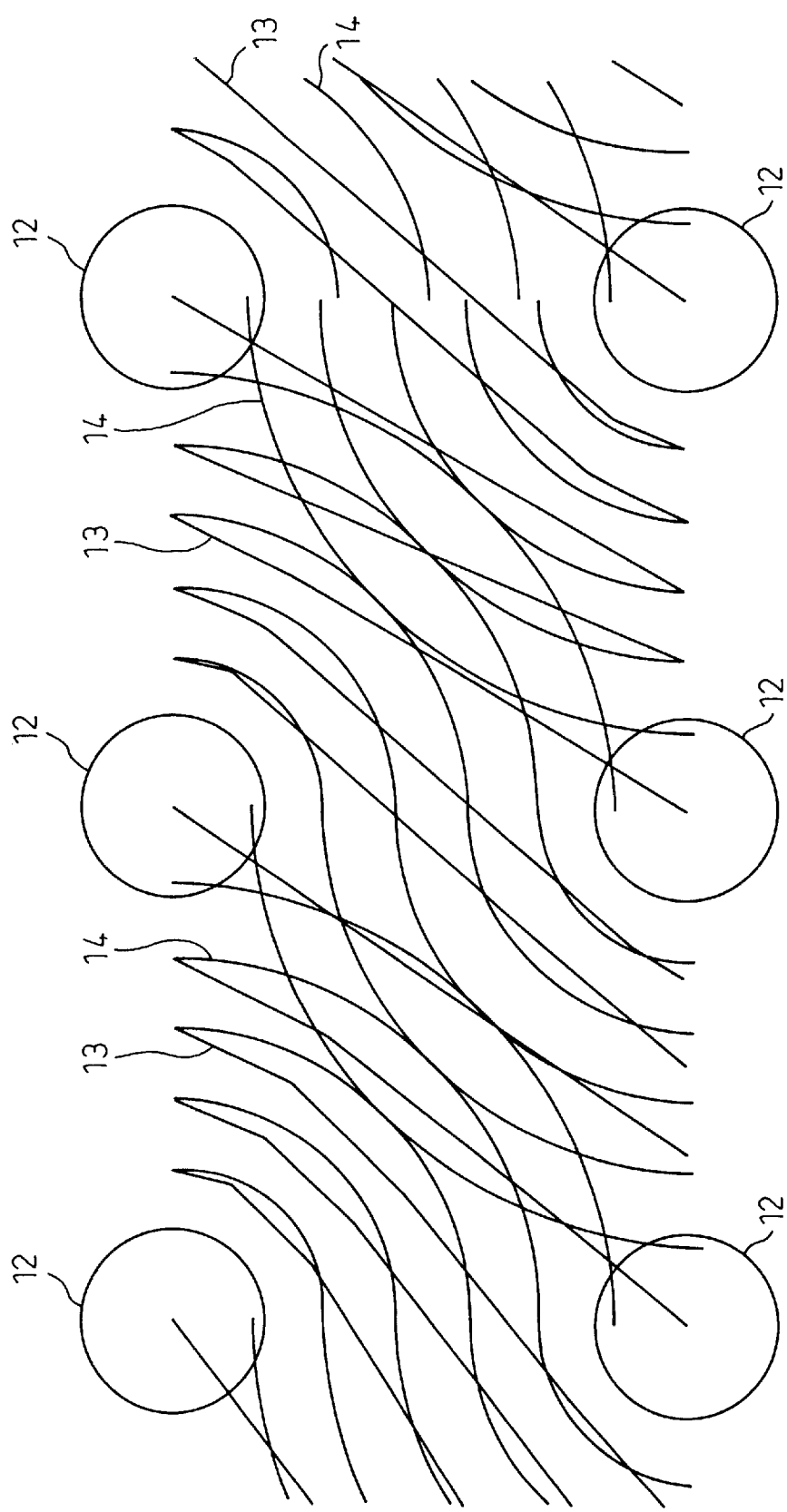
Figure 12:
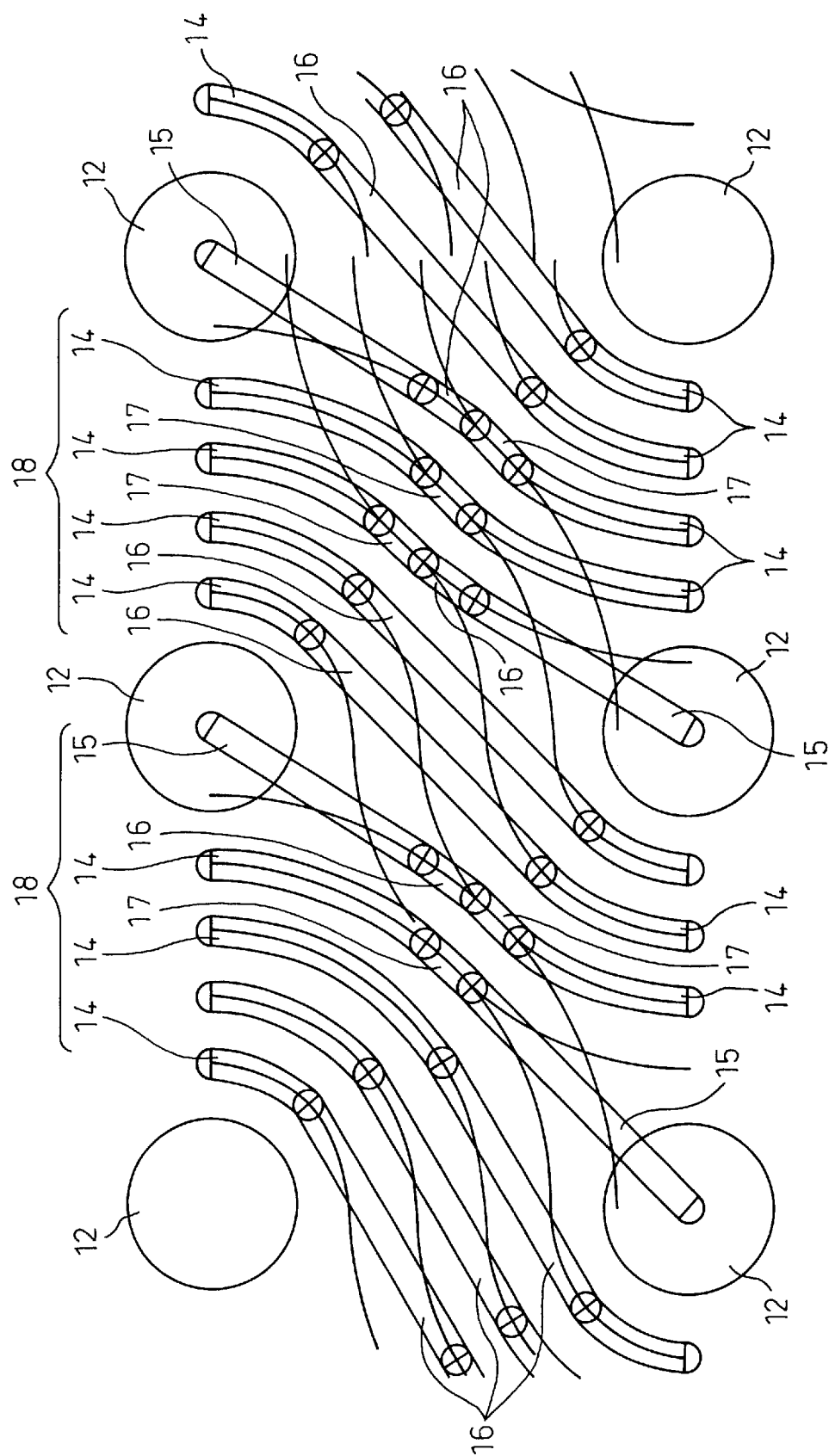
Figure 13:
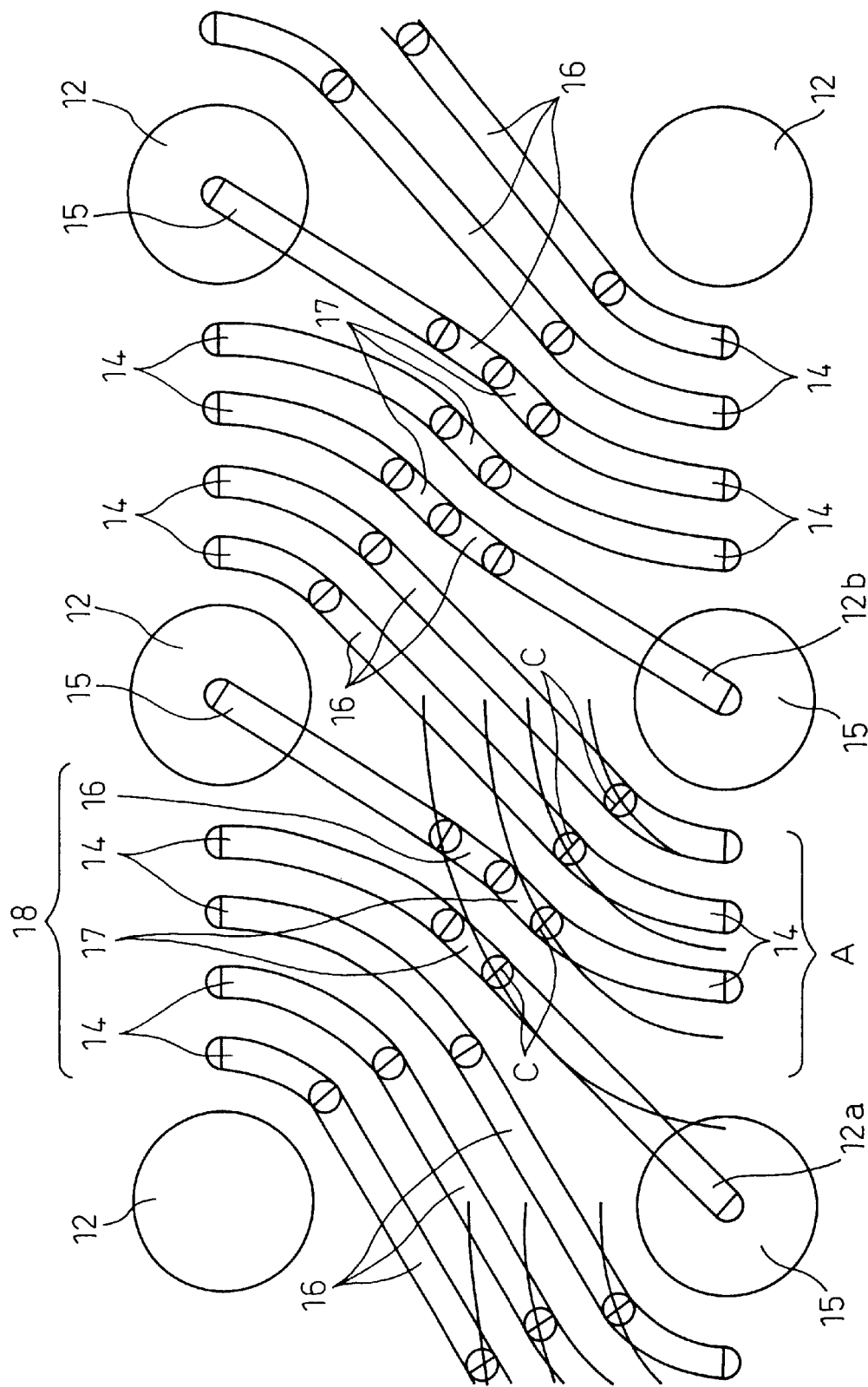

Next, at step S2, the circular arcs 14 are drawn concentrically in the set clearance around each via 12 (refer to FIG. 11).

At step S3, it is decided whether the circular arcs 14 cross the vias 12 (land parts) or not.

When the circular arcs 14 cross the vias 12 (lands), tangent lines (line segments for the wiring) 15 are drawn from the center of the vias 12 (lands) to the corresponding circular arcs (circular arcs for the wiring) 14, at step S4.

When the circular arcs 14 do not cross the vias 12 (lands), tangent lines (line segments for the wiring) 16 are drawn to between the circular arcs (circular arcs for the wiring) 14 where the segments 13 cross the circular arcs, at step S5. When the circular arcs (circular arc for the wiring) 14 cross each other, common tangent lines (line segments for the wiring) 17 are drawn to between the circular arcs (circular arc for the wiring) 14 (refer to FIG. 12). As a result, wiring patterns 18 having preset lines and spaces are formed (refer to FIG. 12).

Next, at step S6, it is decided whether the intervals between the wires are suitable or not in the wiring pattern 18 that passes through between the vias 12. In the case of the example shown in FIG. 13, a deviation has occurred in the lines and spaces of the wiring pattern 18 that passes through an area A between a via 12a and a via 12b.

Figure 14:
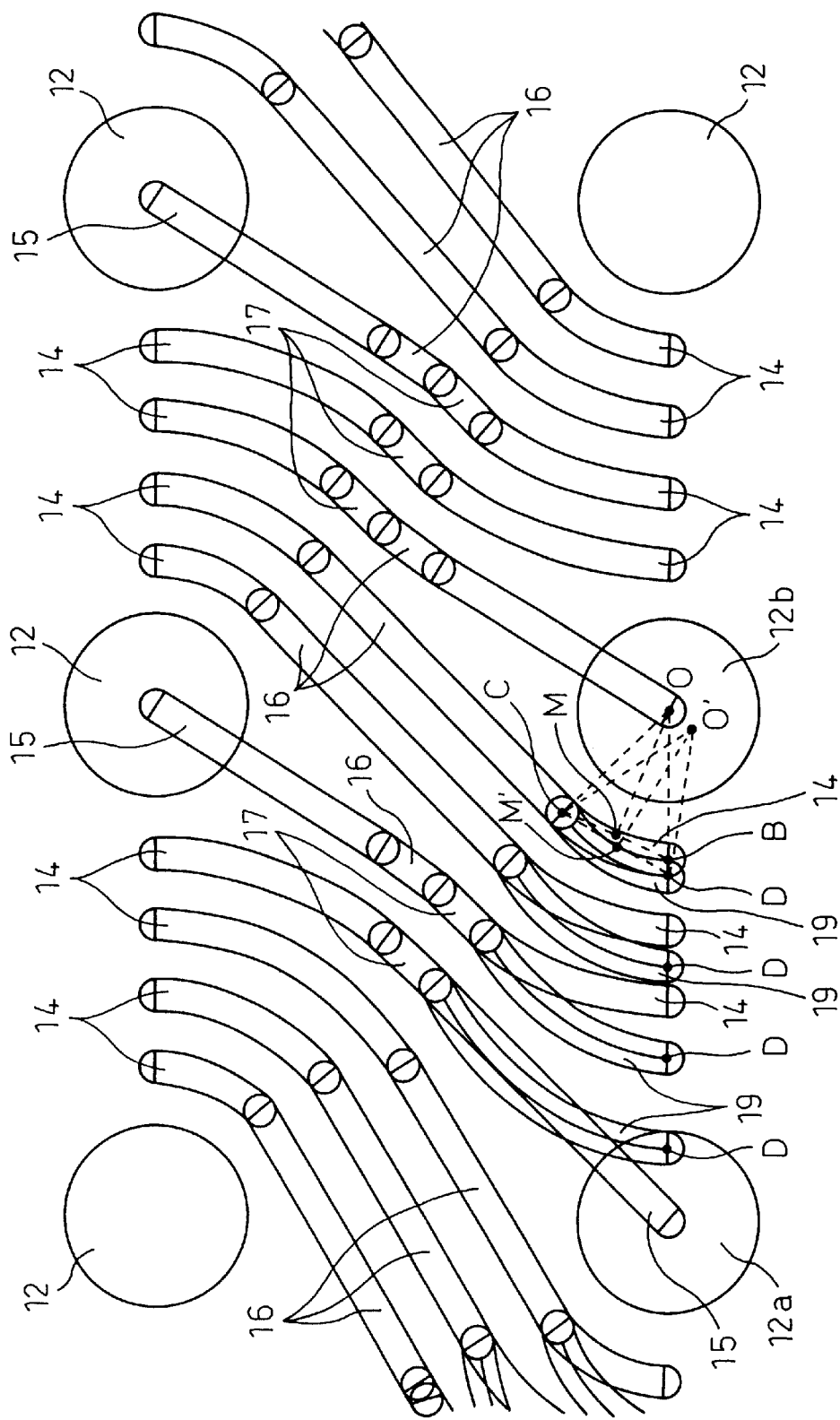

In this case, at step S8, circular arcs for modification 19 are drawn that pass through between each equal point D and a contact point C (a cross point between the circular arc 14 and the tangent lines 16 and 17) (refer to FIG. 14). Instead of the circular arcs for modification 19, ellipses for modification may also be used. However, generally, it is not possible to draw ellipses in the CAD system 1. Therefore, the circular arcs for modification 19 are approximated in FIG. 14.

How to determine a center O' of an ellipse for modification in the case of drawing the circular arc for modification 19 will be explained below.

In FIG. 14, an isosceles triangle OCB is formed that is defined by a contact point C of an original circular arc 14, an end point B, and a center O of a circle of this circular arc 14. In this isosceles triangle OCB, a perpendicular bisector OM is drawn from the vertex O to the side CB. As the side CB is a chord of the circular arc 14, the perpendicular bisector OM passes through the center O of the circle. Therefore, the position of a vertex O' of an isosceles triangle O'CB that is similar to this isosceles triangle OCB may be obtained. A perpendicular bisector drawn from the vertex O' to the side CD is expressed as O'M'. Then, it is possible to obtain the length of the O'M' from the relationship of OM:CB=O'M':CD. As a result, the coordinates of the O' relative to the coordinates of the M' can be determined.

Figure 15:
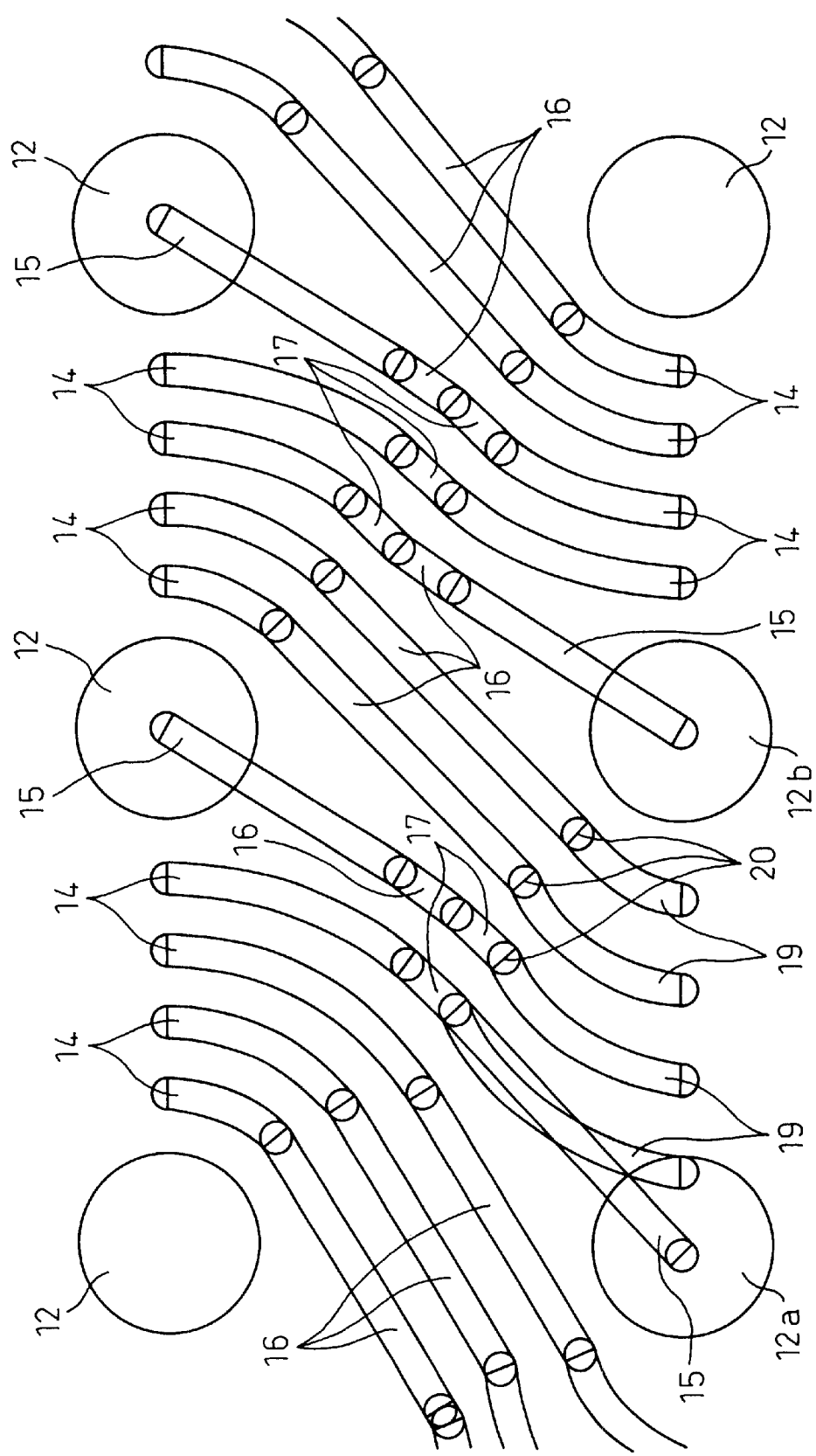
Figure 16:
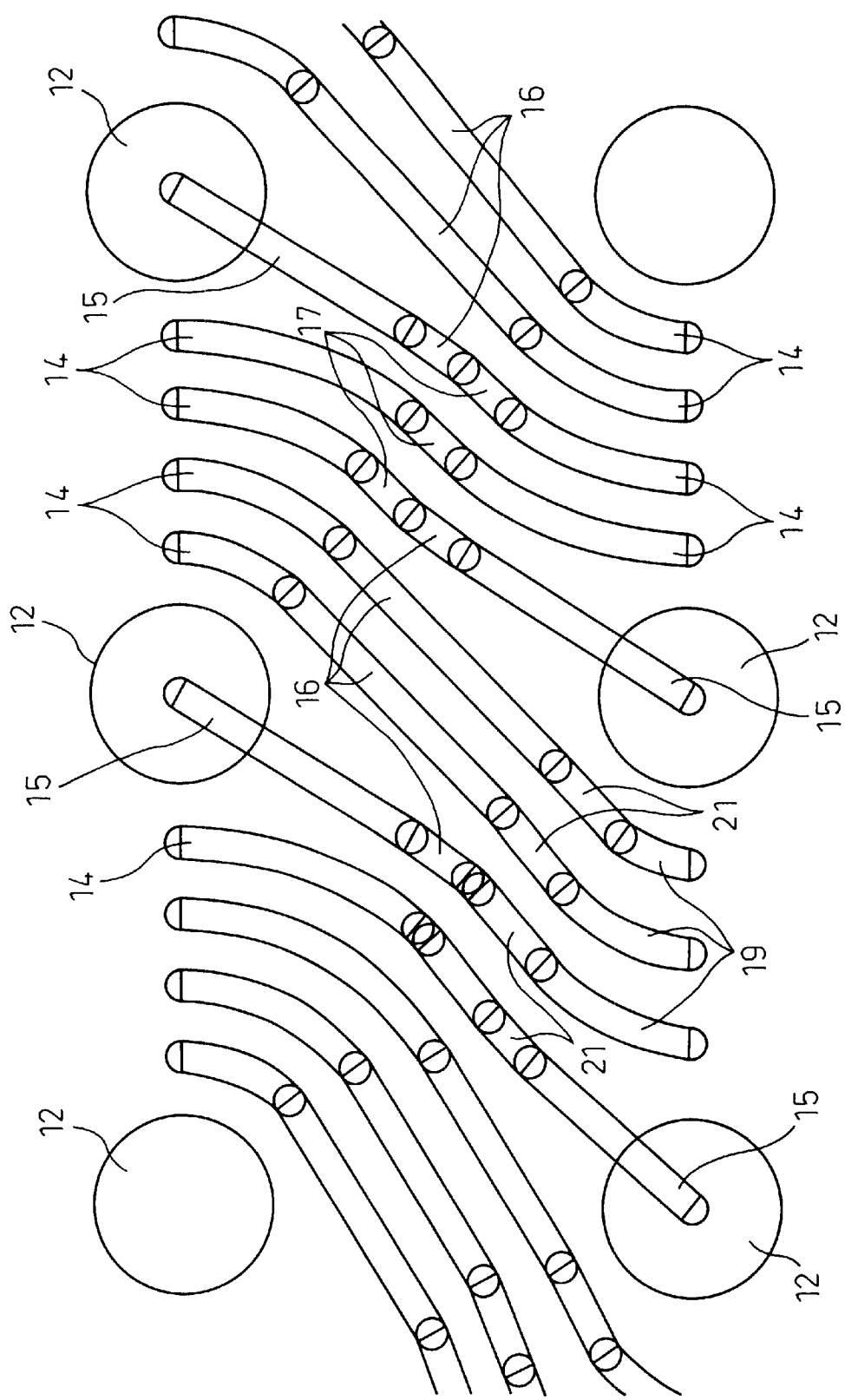

Next, at step S9, the original circular arc 14 is deleted, and each contact point C is connected to the equivalent point D corresponding to this contact point C with the circular arc for modification 19 (refer to FIG. 15).

When the line and space of the wiring pattern 18 formed between the via parts 12 is suitable at step S6, the process proceeds to step S10. A connection portion 20 between the tangent lines 16 and 17 and the circular arc for modification 19 may be formed in a bent shape like a character "V" (refer to FIG. 15).

At step S10, it is decided whether it is necessary to correct the connection portion 20 of the wiring pattern 18 or not. When it is not necessary to correct the connection portion 20, the wiring formation process is finished. When it is necessary to correct the connection portion 20, the process proceeds to step S11.

At step S11, the circular arc for modification 19 is replaced with a line segment for modification 21 that has a length of one to three times the wiring width, based on experience. Specifically, the designer sets the length of the line segment 21 for modification 21 from the input section 5.

At step S12, the connection portion 20 between the tangent lines 16 and 17 and the circular arc for modification 19 is replaced with the line segment for modification 21. When the contact point C is a cross point between the tangent line 15 drawn from the via part 12 and the circular arc for modification 19, the connection portion 20 is replaced with the line segment for modification 21. Thereafter, the circular arc for modification 19 is deleted (refer to FIG. 16).

Figure 17:
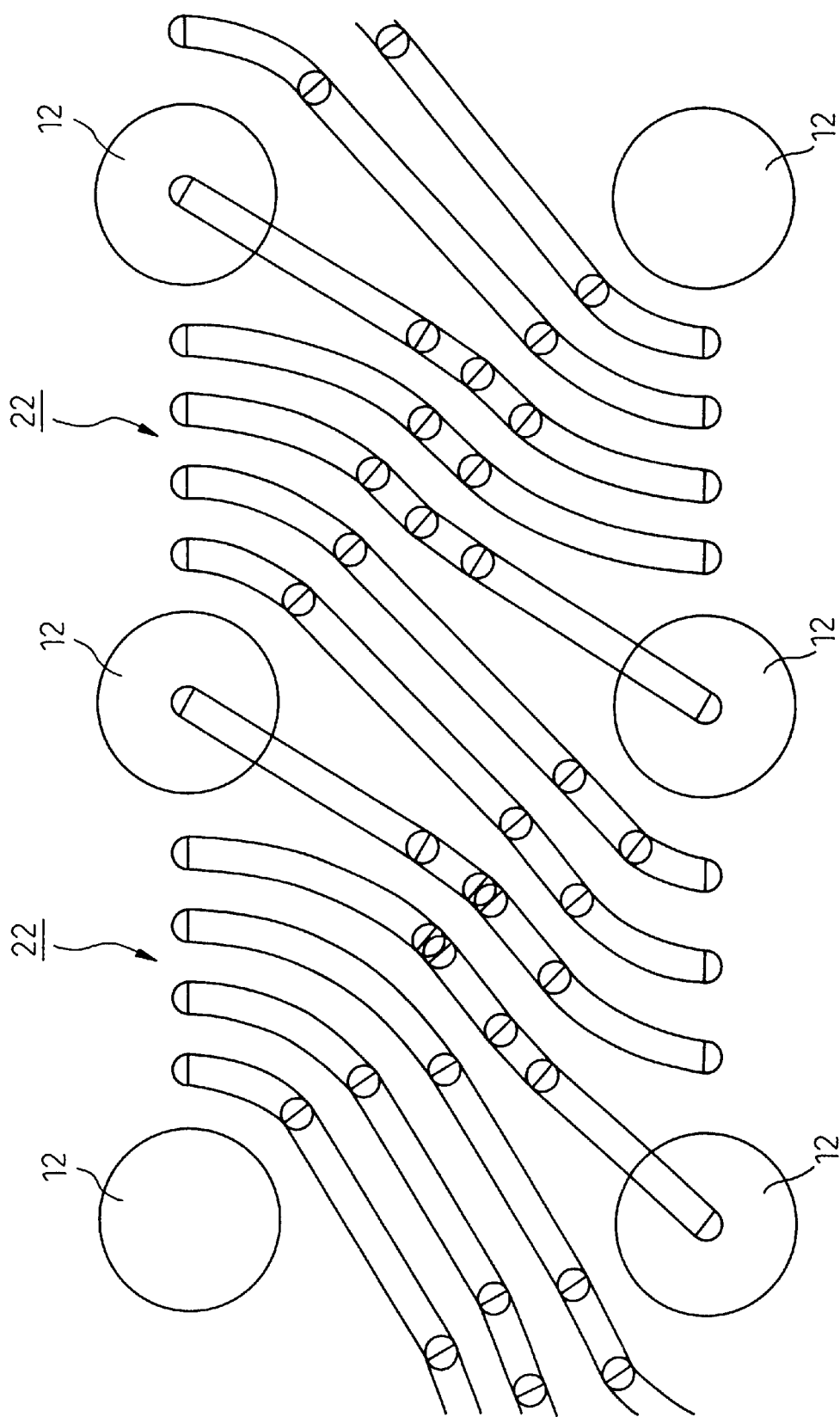
Figure 18:
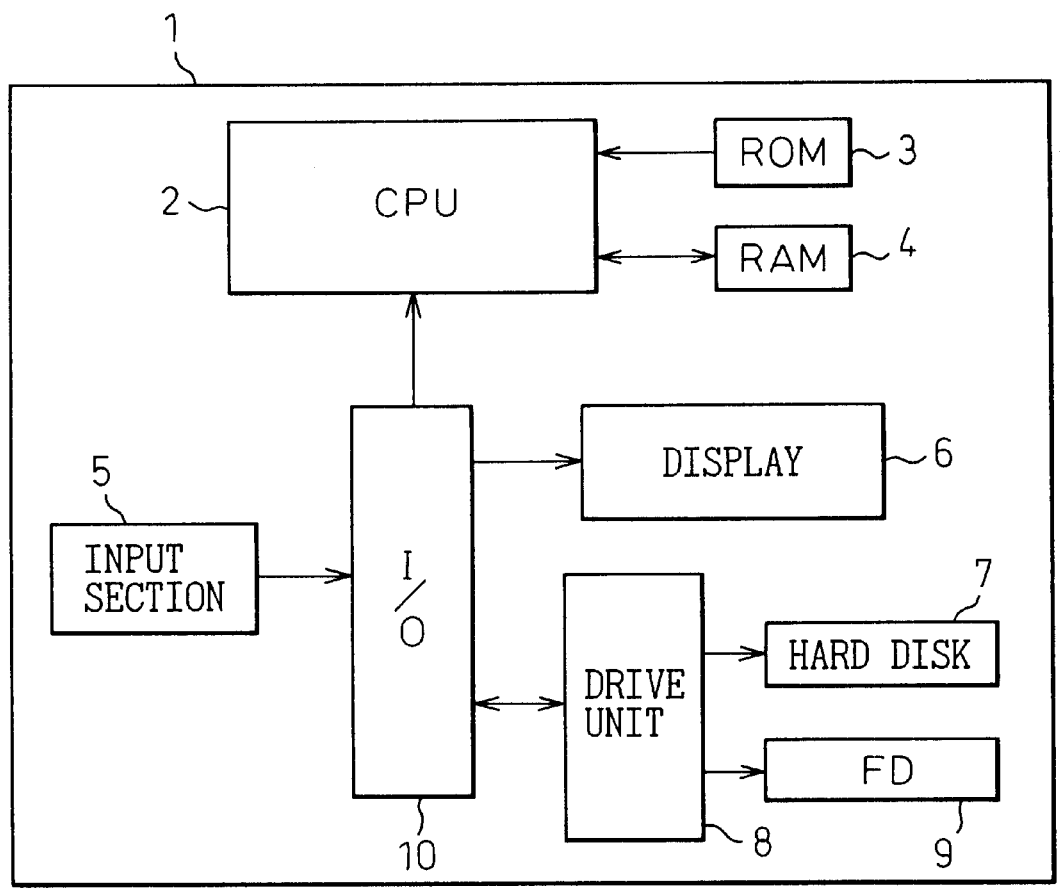
FIG. 18 is a block diagram showing a structure of a CAD system.

Finally, wiring patterns for modification 22 are formed between the bonding pads 11 and the vias 12 in the outermost line of the terminal, as shown in FIG. 17.

As described above, the wiring for a semiconductor package is designed in total, by designing the provisional wiring process and the wiring formation process for each layer.

According to the automatic wiring method relating to the present invention, only the wiring routes are provisionally determined in advance based on the provisional wiring process, and then the actual wiring is carried out automatically by taking into account the lines and spaces, with reference to the design rule in the wiring formation process. Therefore, it is possible to design the wiring at high speed with reduced labor, by reducing complex mathematical operations through taking into account both the wiring routes and the design rule, and by avoiding wasteful redesigning of the total wiring.

Further, in the wiring formation process of the present invention, it is possible finally to design uniformly without deviation while correcting the provisional wiring once arranged. Further, it is possible to form the wiring in a short time. Therefore, it is possible to improve the wiring efficiency, and the productivity of the semiconductor package by preventing the occurrence of poor products.

While the preferred embodiments of the present invention have been explained above, the present invention is not limited to these embodiments. For example, it is not always necessary to determine the lines of the terminals according to the outline of the die pads in the provisional wiring process, but is possible to selectively wire any optional lines of the terminals.

In the above explanation, the wiring is formed of line segments and circular arcs, as the vias 12 (lands) are formed in the shape of a circular drill-hole. However, it is also possible to change the shape of the wiring to match the shape of the vias.

Further, in the above embodiments, the case has been described where the semiconductor chips are wire-bonded to the substrate. However, it is also possible to apply the present invention to the case where the semiconductor chips are flip-chip connected. Needless to mention, it is possible to apply the invention to a multi-layer wiring, and to carry out various modifications within a range while not deviating from the scope and the spirit of the invention.

What is claimed is:

1. An automatic wiring method for a semiconductor package by use of a CAD system, wherein bonding pads to b connected to semiconductor chips and vias round the bonding pads are disposed on a virtual plane, and a wiring pattern is formed by connecting the bonding pads to the vias, the method comprising:

a provisional wiring step for sequentially specifying a first line of a terminal to an n-th line of the terminal, that is from the innermost periphery to the outermost periphery, of the bonding pads, connecting the bonding pads to predetermined vias present on the specified line of the terminal with line segments, and provisionally determining a wiring route for each line of the terminal such that the line segment asses through between the vias at equal intervals.

2. The automatic wiring method for a semiconductor package according to claim 1, the method further comprising:

a wiring formation step for forming the wiring based on a design rule such that the wiring pattern passes through between the lines of the terminals with uniform intervals between wires based on the provisionally wired wiring routes.

3. The automatic wiring method for a semiconductor package according to claim 1 or 2, wherein the provisional wiring step comprises:

a first step for specifying the first line of the terminal at the innermost side of the bonding pads, connecting some of the bonding pads to predetermined vias present on the specified first line of the terminal with line segments, drawing line segments from the rest of the bonding pads to a space between the vias such that the end points of said line segments are disposed at equal intervals, thereby to form wiring routes using said line segments that do not cross each other;

a second step for moving the positions of the vias to correct deviations, when there are the deviations in the wiring routes that pass through between the vias in the first line of the terminal; and a third step for sequentially specifying lines of the terminals after the first line of the terminal, connecting some of the vias present on the corresponding line of the terminal to some of the vias or the end points of the line segments present on the line of the terminal next to the corresponding line of the terminal, further drawing line segments from the rest of the vias or the end points of line segments other than the corresponding vias or the line segments to a space between vias present on the line of the terminal such that the end points of the line segments are disposed at equal intervals, thereby to form wiring routes with line segments that do not cross each other, and moving the positions of vias to correct deviations, when there are deviation in the wiring route that passes through between certain vias in any line of the terminal, thereby to provisionally determine the wiring routes from the bonding pads to the outmost line of the connection terminal by drawing the line segments.

4. The automatic wiring method for a semiconductor package according to claim 2, wherein the wiring formation step comprises:

a step for drawing concentric circular arcs around each via by setting a clearance based on a design rule, by using the provisionally wired wiring routes from the bonding pads to the outermost vias, and forming a wiring pattern by drawing tangent lines between the circular arcs where the provisionally wired line segments cross the circular arcs and between the circular arcs and the vias where the circular arcs cross the vias;

a step for drawing a circular arc for modification by taking into account the distance between vias when a deviation has occurred in the wiring pattern that passes through the vias, and connecting the circular arc for modification to the tangent line; and a step for correcting the wiring pattern, by replacing a connection portion between the tangent line and the circular arc for modification with a line segment for modification.

5. The automatic wiring method for a semiconductor package according to claim 4, wherein the line segment for modification has a length of one to three times the wiring width.

* * * * *

UNITED STATES PATENT AND TRADEMARK OFFICE
CERTIFICATE OF CORRECTION

PATENT NO.    : 6,596,549 B2
DATED         : July 22, 2003
INVENTOR(S)   : Tamotsu Kitamura et al.

It is certified that error appears in the above-identified patent and that said Letters Patent is hereby corrected as shown below:

<u>Title page,</u>
The *Primary Examiner*'s name should be changed from "George Pourson" to
-- George Fourson --.

<u>Column 8,</u>
Line 38, "b connected" should be changed to -- be connected --.
Line 38, "vias round" should be changed to -- vias around --.
Line 49, "asses" should be changed to -- passes --.

Signed and Sealed this

Thirtieth Day of December, 2003

JAMES E. ROGAN
*Director of the United States Patent and Trademark Office*